(12) United States Patent
Baars et al.

(10) Patent No.: US 9,608,003 B2
(45) Date of Patent: Mar. 28, 2017

(54) INTEGRATED CIRCUIT PRODUCT WITH BULK AND SOI SEMICONDUCTOR DEVICES

(71) Applicant: GLOBALFOUNDRIES Inc., Grand Cayman (KY)

(72) Inventors: Peter Baars, Dresden (DE); Hans-Peter Moll, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/193,770

(22) Filed: Jun. 27, 2016

(65) Prior Publication Data

US 2016/0307926 A1 Oct. 20, 2016

Related U.S. Application Data

(62) Division of application No. 14/592,069, filed on Jan. 8, 2015, now Pat. No. 9,443,871.

(51) Int. Cl.
*H01L 29/49* (2006.01)
*H01L 27/12* (2006.01)
(Continued)

(52) U.S. Cl.
CPC ........ *H01L 27/1207* (2013.01); *H01L 21/308* (2013.01); *H01L 21/3212* (2013.01); *H01L 21/76224* (2013.01); *H01L 21/84* (2013.01); *H01L 27/0629* (2013.01); *H01L 28/20* (2013.01); *H01L 28/40* (2013.01); *H01L 29/0847* (2013.01); *H01L 29/41783* (2013.01);
(Continued)

(58) Field of Classification Search
CPC .............. H01L 21/308; H01L 21/3212; H01L 21/76224; H01L 27/0629; H01L 28/20
See application file for complete search history.

(56) References Cited

U.S. PATENT DOCUMENTS 9,082,837 B2 7/2015 Perera
2013/0087855 A1 4/2013 Makiyama et al.
(Continued)

OTHER PUBLICATIONS

Translation of Taiwanese Office Action dated Jul. 27, 2016, for Taiwan Patent Application No. 104138217.

*Primary Examiner* — Michael Shingleton
(74) *Attorney, Agent, or Firm* — Amerson Law Firm, PLLC (57) ABSTRACT

An integrated circuit product is disclosed including an SOI structure including a bulk semiconductor substrate, a buried insulation layer positioned on the bulk semiconductor substrate and a semiconductor layer positioned on the insulation layer, wherein, in a first region of the SOI structure, the semiconductor layer and the buried insulation layer are removed and, in a second region of the SOI structure, the semiconductor layer and the buried insulation layer are present above the bulk semiconductor substrate. The product further includes a semiconductor bulk device comprising a first gate structure positioned on the bulk semiconductor substrate in the first region and an SOI semiconductor device comprising a second gate structure positioned on the semiconductor layer in the second region, wherein the first and second gate structures have a final gate height substantially extending to a common height level above an upper surface of the bulk semiconductor substrate.

10 Claims, 10 Drawing Sheets (51) Int. Cl.
*H01L 21/308* (2006.01)
*H01L 21/321* (2006.01)
*H01L 21/762* (2006.01)
*H01L 21/84* (2006.01)
*H01L 27/06* (2006.01)
*H01L 49/02* (2006.01)
*H01L 29/08* (2006.01)
*H01L 29/417* (2006.01)
*H01L 29/66* (2006.01)
*H01L 29/78* (2006.01)

(52) U.S. Cl.
CPC ...... *H01L 29/495* (2013.01); *H01L 29/66545* (2013.01); *H01L 29/7838* (2013.01)

(56) References Cited

U.S. PATENT DOCUMENTS

| | | |
|---|---|---|
| 2013/0134520 A1 | 5/2013 | Maeda et al. |
| 2013/0146959 A1 | 6/2013 | Cheng et al. |
| 2013/0264644 A1 | 10/2013 | Tsunomura et al. |
| 2015/0221648 A1 | 8/2015 | Gimbert |
| 2016/0111549 A1 | 4/2016 | Baars et al. |

INTEGRATED CIRCUIT PRODUCT WITH BULK AND SOI SEMICONDUCTOR DEVICES

BACKGROUND OF THE INVENTION

1. Field of the Invention

The present disclosure relates to cointegration of bulk and SOI semiconductor devices at advanced technology nodes and, more particularly, to an integrated circuit product comprising FET semiconductor devices on SOI substrate portions and FET and/or NONFET semiconductor devices on bulk substrate portions of a semiconductor substrate.

2. Description of the Related Art

In modern electronic equipment, integrated circuits (ICs) experience a vast applicability in a continuously spreading range of applications. In particular, the demand for increasing mobility of electronic devices at high performance and low energy consumption drives developments to more and more compact devices having features with sizes significantly smaller than 1 μm, the more so as current semiconductor technologies are apt of producing structures with dimensions in the magnitude of 100 nm or less. With ICs representing a set of electronic circuit elements integrated on a semiconductor material, normally silicon, ICs can be made much smaller than any discreet circuit composed of separate independent circuit components. Indeed, the majority of present-day ICs are implemented by using a plurality of circuit elements, such as field effect transistors (FETs), also called metal oxide semiconductor field effect transistors (MOSFETs) or simply MOS transistors, and passive elements, such as resistors, e.g., diffusion resistors, and capacitors, integrated on a semiconductor substrate with a given surface area. Typical present-day ICs involve millions of single circuit elements formed on a semiconductor substrate.

The basic function of a FET is that of an electronic switching element, controlling a current through a channel region between two junction regions, referred to as source and drain, by a gate electrode which is disposed over the channel region and to which a voltage relative to source and drain is applied. In common FETs, the channel region extends along the plane between the source and drain regions. Generally, in applying a voltage exceeding a characteristic voltage level to the gate electrode, the conductivity state of the channel is changed and switching between a conducting state or "ON state" and a non-conducting state or "OFF state" may be achieved. It is important to note that the characteristic voltage level at which the conductivity state changes (usually called the "threshold voltage") therefore characterizes the switching behavior of the FET and it is an issue to keep variations in the threshold voltage level low for implementing a well-defined switching characteristic. However, with the threshold voltage depending nontrivially on the transistors' properties, e.g., materials, dimensions, etc., the implementation of a desired threshold voltage value during fabrication processes involves careful adjustment and fine-tuning during the fabrication process, which makes the fabrication of advanced semiconductor devices increasingly complex.

The continued miniaturization of semiconductor devices into the deep submicron regime becomes more and more challenging with smaller dimensions. One of the several manufacturing strategies employed herein is the implementation of SOI technologies. SOI (silicon-on-insulator) refers to the use of a layered silicon-insulator-silicon substrate in place of conventional silicon substrates in semiconductor manufacturing, especially microelectronics, to reduce parasitic device capacitances and short channel effects, thereby improving performance. Semiconductor devices on the basis of SOI differ from conventional semiconductor devices formed on a bulk substrate in that the silicon junction is formed above an electrical insulator, typically silicon dioxide or sapphire (these types of devices are called silicon-on-sapphire or SOS devices). The choice of insulator depends largely on the intended application, with sapphire usually being employed in high performance radio frequency applications and radiation-sensitive applications, and silicon dioxide providing for diminished short channel effects in microelectronic devices.

One basically distinguishes between two types of SOI devices, PDSOI (partially depleted SOI) devices and FDSOI (fully depleted SOI) devices. The PDSOI and FDSOI devices differ by the thickness of the semiconductor layer which is disposed over a buried oxide layer, as will be explained with regard to FIG. 1 below. Particularly, the thickness of the semiconductor layer of PDSOI devices is so large that the depletion region formed in the semiconductor layer does not cover the whole channel region provided in the semiconductor layer. Therefore, PDSOI devices behave to a certain extent like bulk semiconductor devices. FDSOI devices, on the other hand, have a semiconductor film formed on the buried oxide layer such that the depletion region in FDSOI devices substantially covers the whole semiconductor film. Due to the increase in the inversion charges in FDSOI devices, these devices have a higher switching speed. Furthermore, FDSOI devices do not require any doping in the channel region. In general, drawbacks of bulk semiconductor devices, like threshold roll-off, higher sub-threshold slop body effect, short channel effects, etc., are reduced.

Figure 1:
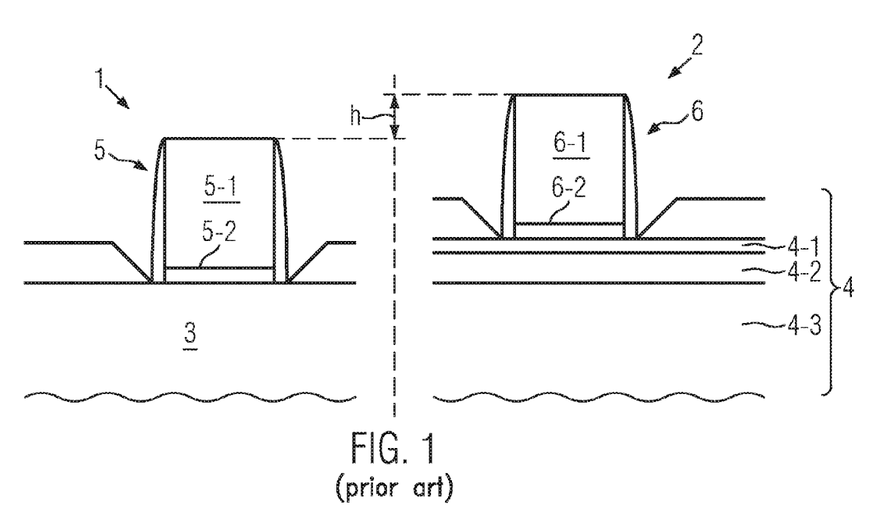
FIG. 1 schematically illustrates, in a cross-sectional view, a bulk semiconductor device and an SOI semiconductor device as known in the art.

A conventional SOI-based semiconductor device, as illustrated schematically on the right-hand side of FIG. 1, generally comprises a semiconductor layer 4-1, e.g., on the basis of silicon and/or germanium, being formed on an insulating layer 4-2, e.g., silicon dioxide, which insulating layer 4-2 is often referred to as buried oxide (BOX) layer. The BOX layer 4-2, in turn, is disposed on a semiconductor substrate 4-3, e.g., a silicon substrate. Accordingly, a so-called SOI substrate 4 is formed.

From a physical point of view, the very thin semiconductor film 4-1 over the BOX layer 4-2 enables the semiconductor material under a gate 6 of a transistor, i.e., in the channel region of the semiconductor device, to be fully depleted of charges in case that an appropriate thickness of the semiconductor film 4-1 is chosen. The net effect is that a gate 6 (formed by a gate electrode 6-1 and a gate oxide 6-2) disposed over the SOI substrate 4 can now very tightly control the full volume of the body of a transistor 2 which includes the gate 6. In contrast to the SOI device 2, a bulk device 1 is schematically illustrated on the left-hand side of FIG. 1. Herein, a gate 5 of the bulk device 1, including a gate electrode 5-1 and a gate insulating structure 5-2, is disposed on a semiconductor bulk substrate 3, such as a silicon and/or germanium substrate. In general, due to the tight control of the full volume in the SOI device 2, the SOI device 2 is much better behaved than the bulk device 1, especially because the supply voltage, i.e., the gate voltage, gets lower, and device dimensions are allowed to be scaled without suffering from short channel effects.

The design process flows and design methodologies to design an FDSOI device are the same as those classically used with bulk CMOS techniques, building upon SPICE models suitable for FDSOI devices. Basic advantages of FDSOI devices over bulk devices is the lack of a floating body effect or kink effect associated to PDSOI. Using the SOI technique still leaves the option during the fabrication process to locally remove the top silicon and BOX layers to reach the semiconductor substrate, e.g., the base silicon, and to cointegrate devices on SOI together with (non-geometric critical) bulk devices. However, as indicated in FIG. 1, a cointegration of bulk and SOI devices shows a step height between the SOI substrate 4 and the bulk substrate 3, as it is denoted by the height difference h in FIG. 1. With conventional thicknesses of the top silicon layer 4-1 and the BOX layer 4-2 of about 20 nm, the height difference h substantially is in the range of about 30-50 nm.

On the other hand, it is often desirable to implement different structures on a single wafer, e.g., to integrate more functions into a given wafer surface portion. Therefore, in advanced semiconductor device structures, it may be desirable to form NONFET devices, e.g., capacitors, resistors, diodes, etc., on a bulk substrate in parallel to SOI devices.

In any case, the cointegration of SOI and bulk devices results in removing the top silicon layer and BOX layer over a large area of an SOI substrate, leaving behind a huge topology. As the conventional approach for integrating FDSOI devices is usually employing gate-first techniques, the topology indicated by h in FIG. 1 adds extra complexity and problems to existing integration processes. For example, it turns out to be difficult to form a channel silicon germanium (cSiGe) layer and to provide a sufficiently reliable encapsulation of high-k materials during the fabrication process.

In view of the above-described situation, it is, therefore, desirable to provide methods of forming a semiconductor device structure which overcome the topology issues associated with the cointegration of bulk devices and FDSOI devices and to provide cointegrated bulk and SOI semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one illustrative embodiment, an integrated circuit product is disclosed including an SOI structure including a bulk semiconductor substrate, a buried insulation layer positioned on the bulk semiconductor substrate and a semiconductor layer positioned on the insulation layer, wherein, in a first region of the SOI structure, the semiconductor layer and the buried insulation layer are removed and, in a second region of the SOI structure, the semiconductor layer and the buried insulation layer are present above the bulk semiconductor substrate. The integrated circuit product further includes a semiconductor bulk device comprising a first gate structure positioned on the bulk semiconductor substrate in the first region and an SOI semiconductor device comprising a second gate structure positioned on the semiconductor layer in the second region, wherein the first and second gate structures have a final gate height substantially extending to a common height level above an upper surface of the bulk semiconductor substrate.

In another illustrative embodiment, an integrated circuit product is disclosed including an SOI structure including a bulk semiconductor substrate, a buried insulation layer positioned on the bulk semiconductor substrate and a semiconductor layer positioned on the insulation layer, wherein, in a first region of the SOI structure, the semiconductor layer and the buried insulation layer are removed and, in a second region of the SOI structure, the semiconductor layer and the buried insulation layer are present above the bulk semiconductor substrate. The integrated circuit product further includes a resistor device positioned on the bulk semiconductor substrate in the first region, the resistor device being formed by a resistor material, and an SOI semiconductor device comprising a gate structure positioned on the semiconductor layer in the second region, wherein an upper surface of the resistor material and an upper surface of the gate structure substantially extend to a common level above an upper surface of the bulk semiconductor substrate.

In yet another illustrative embodiment, an integrated circuit product is disclosed including an SOI structure including a bulk semiconductor substrate, a buried insulation layer positioned on the bulk semiconductor substrate and a semiconductor layer positioned on the insulation layer, wherein, in a first region of the SOI structure, the semiconductor layer and the buried insulation layer are removed and, in a second region of the SOI structure, the semiconductor layer and the buried insulation layer are present above the bulk semiconductor substrate. The integrated circuit product further includes a capacitor device with a capacitor material positioned on the semiconductor substrate in the first region and an SOI semiconductor device comprising a gate structure positioned on the semiconductor layer in the second region, wherein an upper surface of the capacitor material and an upper surface of the gate structure substantially extend to a common height level above an upper surface of the bulk semiconductor substrate.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example smaller than 50 nm or smaller than 35 nm, i.e., ground rules smaller or equal to 45 nm may be imposed. The person skilled in the art will appreciate that the present disclosure suggests semiconductor circuit elements having structures with minimal length and/or width dimensions smaller than 100 nm, for example smaller than 50 nm or smaller than 35 nm. For example, the present disclosure may provide for semiconductor devices fabricated by using 45 nm technologies or below, e.g., 28 nm or below.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

In the following, various illustrative embodiments of the present disclosure will be described, wherein an SOI substrate having trench isolation structures, e.g., shallow trench isolation (STI) structures, will be formed. In the following, reference will be made to FIG. 2a. Herein, an SOI substrate 100 is shown, the SOI substrate 100 being formed by a semiconductor material layer 30 disposed over a semiconductor substrate 10, wherein a buried oxide (BOX) layer 20 is disposed between the semiconductor material layer 30 and the semiconductor substrate 10. In accordance with some illustrative embodiments of the present disclosure, the semiconductor material layer 30 may comprise at least one of silicon and germanium. According to some embodiments of the present disclosure, the semiconductor material layer 30 may have a thickness in a range from about 5-10 nm, e.g., about 7 nm, and the BOX layer 20 may have a thickness in a range from about 20-30 nm, e.g., about 25 nm.

Figure 2A:
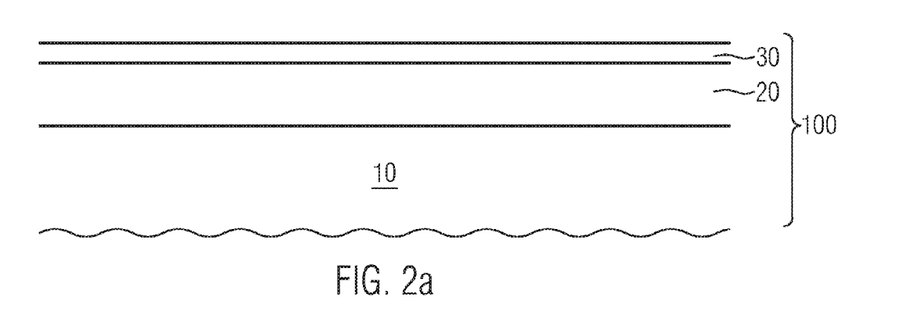
FIGS. 2a-2d schematically illustrate, in cross-sectional views, the formation of an SOI semiconductor substrate with trench isolation structures in accordance with some illustrative embodiments of the present disclosure.

The SOI substrate 100, as illustrated in FIG. 2a, may be obtained by conventional techniques, e.g., in a so-called SIMOX process, implanting oxide ions into a silicon wafer to a certain depth for forming an oxygen-rich layer at the certain depth in the silicon wafer, performing a high temperature annealing process for forming a silicon oxide layer from the oxygen-rich layer at the certain depth such that the silicon oxide layer represents a buried oxide layer. Another way of fabricating the SOI substrate may employ, for example, the so-called smart cut process. Herein, the SOI substrate 100 may be fabricated by performing a surface oxidation on a semiconductor wafer for forming an oxide layer on an upper surface of the semiconductor wafer, performing a hydrogen implantation step for implanting hydrogen at a certain depth under the oxide layer into the semiconductor wafer, flipping the wafer and bonding the wafer to a handle wafer such that the oxide layer is located at the interface of the semiconductor wafer and the handle wafer, causing a bubble formation step for forming bubbles from the implanted hydrogen layer and breaking the composite wafer at the bubbles, and performing a CMP process for smoothening the broken surface, wherein a width dimension of the handle wafer material below the oxide layer is adjusted by appropriately cutting the handle wafer.

Figure 2B:
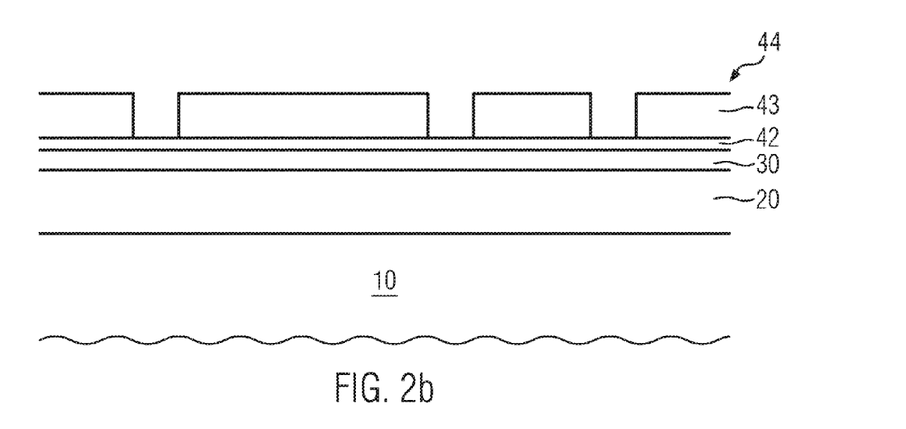
Figure 2C:
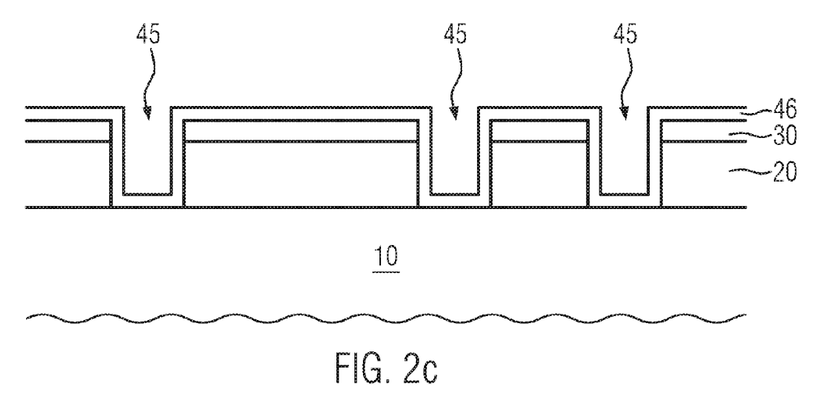

After providing the SOI substrate 100, as illustrated in FIG. 2a, a first shallow trench isolation (STI) structure is formed, as will be explained with regard to the FIGS. 2b-2d. FIG. 2b schematically illustrates the SOI substrate 100 from FIG. 2a at a phase during fabrication, after which a patterned hard mask 44 is formed over the semiconductor layer 30 of the SOI substrate 100. The patterned hard mask 44 may comprise a nitride layer 42 disposed on the semiconductor layer 30 and a patterned resin layer 43 provided on the nitride layer 42. The patterned resin layer 43 may be patterned by common lithographical techniques. In accordance with some alternative embodiments of the present disclosure, a stack of oxide material and nitride material, e.g., cap oxide-pad nitride-pad oxide, may be formed instead of the nitride layer 42.

Next, reference will be made to FIG. 2c. After having performed an etch process through the patterned hard mask 44, trenches 45 may be formed in the semiconductor layer 30 and the BOX layer 20, the trenches ending on the semiconductor substrate 10 such that upper surface regions of the semiconductor substrate 10 are exposed. Subsequently, the patterned hard mask 44 is removed, and an optional oxide liner 46 may be deposited in order to protect the exposed areas of the semiconductor substrate 10 during subsequent processing.

Figure 2D:
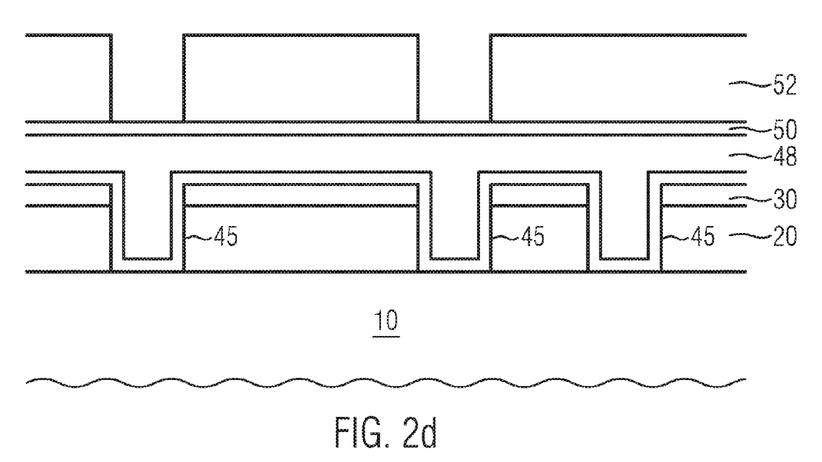

Thereafter, as illustrated in FIG. 2d, a planarizing layer 48 is deposited over the SOI substrate 100, overfilling the trenches 45. In accordance with some illustrative embodiments, the planarizing layer 48 may be formed by spin-on techniques. Another hard mask may be formed on the planarizing layer, e.g., by depositing a nitride layer 50 and forming a patterned photo resin 52 on the nitride layer 50, e.g., by an Rx lithography step for deep STI trenches. The person skilled in the art will appreciate that the patterned hard mask system, as it is illustrated in FIG. 2d, is patterned for forming deep shallow trench isolation (STI) structures substantially extending into the semiconductor substrate 10. The accordingly formed deep STI structures (depicted in FIG. 3a and denoted by reference numeral 47) have a greater depth than the STI structures 45 which end on an upper surface of the semiconductor substrate 10.

Figure 3A:
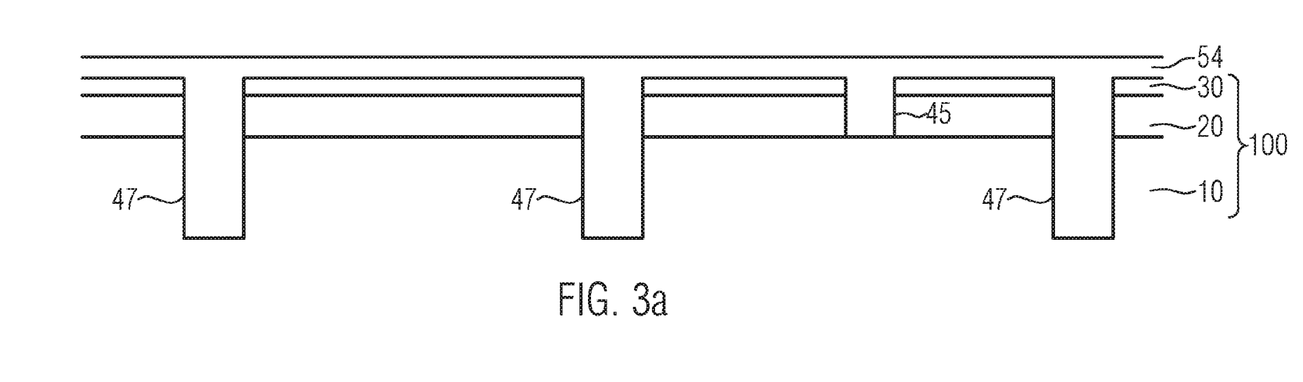
FIGS. 3a-3c schematically illustrate, in cross-sectional views, the formation of a bulk semiconductor portion in the SOI substrate in accordance with some illustrative embodiment of the present disclosure.

FIG. 3a schematically illustrates the SOI substrate 100 after an etch process (not illustrated) has been performed through the hard mask system 50, 52, which is illustrated in FIG. 2d, wherein deep STI trenches 47 are etched into the semiconductor substrate 10. Therefore, according to the hard mask pattern 50, 52 illustrated in FIG. 2d, deep STI trenches 47 and STI structures 45 are formed in the SOI substrate 100, wherein the deep STI trenches 47 extend into the semiconductor substrate, while the STI structures 45 end on an upper surface of the semiconductor substrate 10. After having performed a cleaning process (not illustrated), a resist and hard mask strip process (not illustrated) is performed and the trenches 47, 45 are exposed and overfilled with an insulating material, e.g., silicon oxide, which is exposed to a chemical mechanical polishing (CMP) process (not illustrated) such that the insulating layer 54 is formed as illustrated in FIG. 3a. Although not explicitly illustrated, a dry deglaze process and a nitride strip may be further performed in the processes performed between the stages depicted in FIGS. 2d and 3a.

Figure 3B:
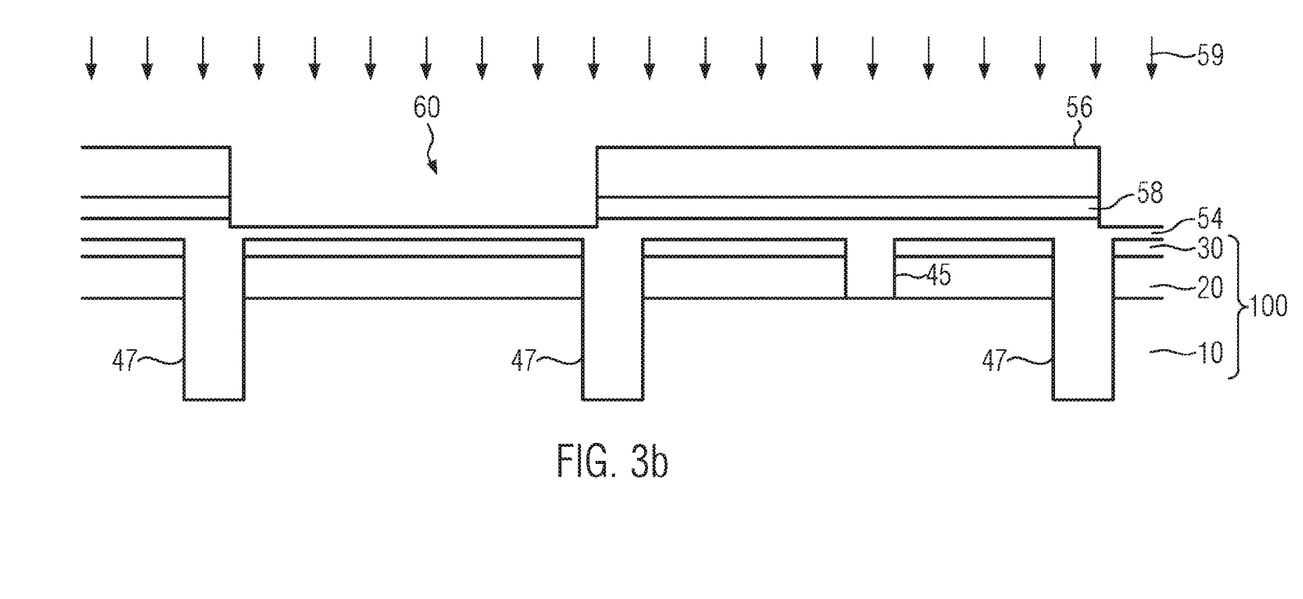

FIG. 3b schematically illustrates the SOI substrate 100 after further processing has been performed, i.e., after a further hard mask 56, 58 is deposited over the SOI substrate 100, the hard mask 56, 58 comprising a patterned photo resin 56 and a nitride layer 58, which is, at the stage illustrated in FIG. 3b, already opened by a reactive ion etch (RIE) step 59 so as to form a recess 60 in alignment with the hard mask 56, 58.

Figure 3C:
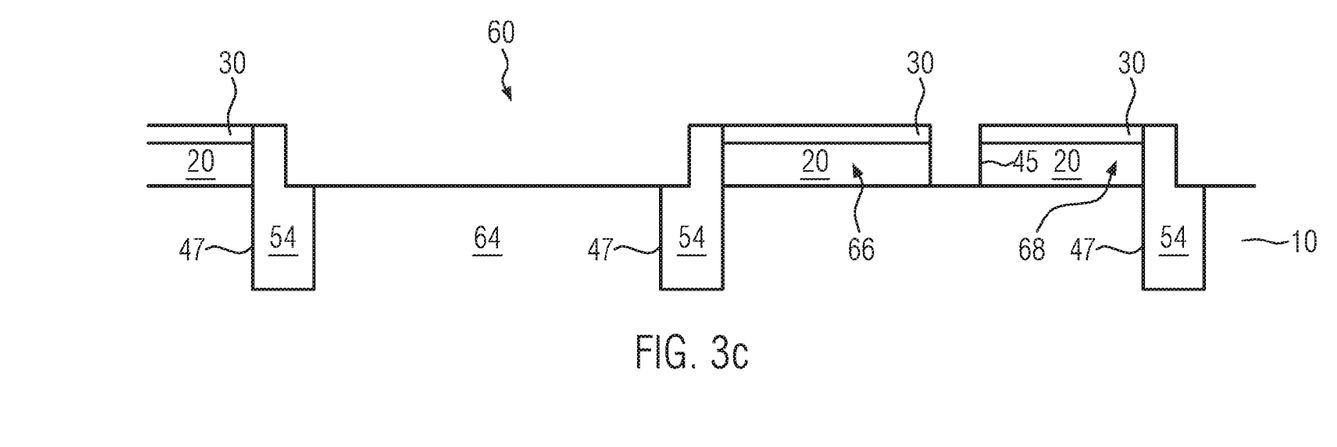

FIG. 3c schematically illustrates the SOI structure 100 as illustrated in FIG. 3b, after the RIE step 59 is completed and the recess 60 is formed between two deep STI structures 47 such that the semiconductor substrate 10 is exposed between the deep STI structures 47. Therefore, the region of the semiconductor substrate 10 being exposed during the RIE step 59 represents a semiconductor bulk substrate portion 64 adjacent to SOI substrate portions 66, 68, which are separated by the STI structure 45 from each other and being separated from the semiconductor bulk substrate portion 64 by the deep STI structure 47, as illustrated in FIG. 3c. At this stage in the fabrication, well implants (not illustrated) may be performed in order to dope the semiconductor bulk substrate portion 64. Herein, a scatter oxide liner (not illustrated) may be deposited for supporting the well implantation processes (not illustrated).

In accordance with some illustrative embodiments herein, the photo resist 56 may be stripped off and the planarizing material 54, the semiconductor material layer 30 and the BOX layer 20 may be etched over the semiconductor bulk substrate portion 64 down to an upper surface of the semiconductor substrate 10, using the nitride material 58 as a hard mask. Thereafter, a strip process (not illustrated) may be applied to remove the nitride material 58 and, optionally, the scatter oxide liner (not illustrated) may be formed.

In accordance with some illustrative embodiments of the present disclosure, gate structures may be subsequently formed over at least one of the bulk and SOI regions in accordance with gate-first techniques. Alternatively, dummy gate structures may be formed over at least one of the bulk and SOI regions in accordance with gate-last techniques. The formation of gate structures or dummy gate structures will be described with regard to FIGS. 4a-4f below in greater detail.

Figure 4A:
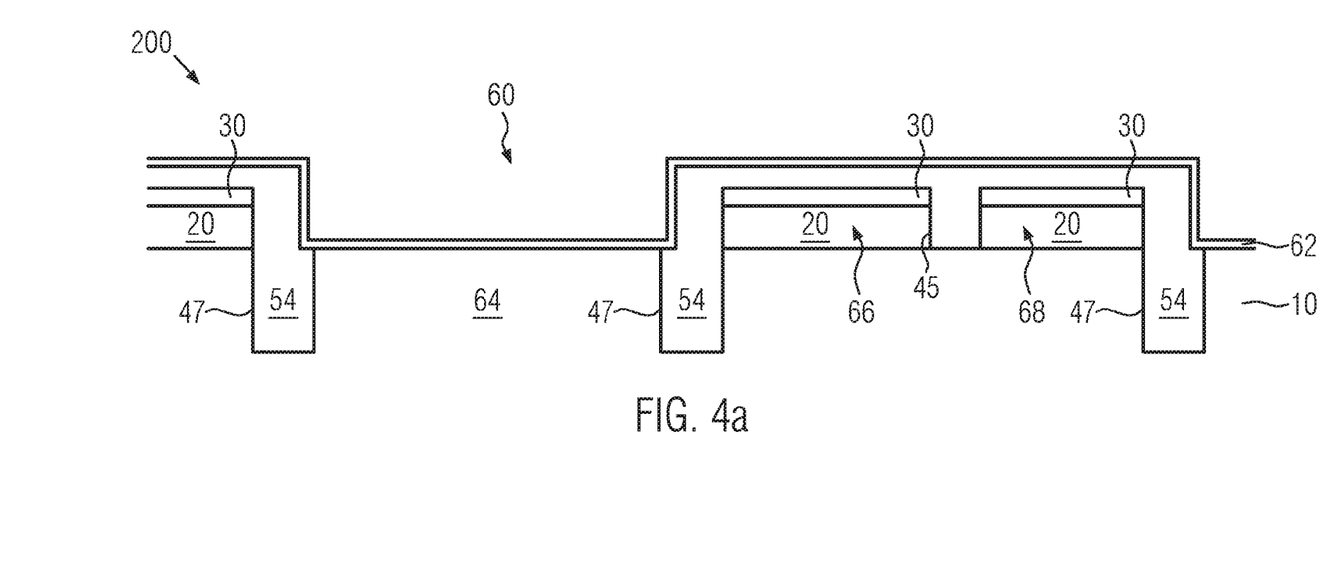
FIGS. 4a-4f schematically illustrate, in cross-sectional views, the formation of gate structures over the semiconductor bulk substrate and the SOI substrate in accordance with some illustrative embodiments of the present disclosure.

FIG. 4a schematically illustrates, in a cross-sectional view, a semiconductor device structure 200 comprising the semiconductor bulk substrate region 64 and the SOI substrate regions 66, 68. Subsequent to the processing described above, a gate insulating structure may be formed over the semiconductor device structure 200, e.g., by means of a gate insulating material and/or a work function adjusting material being deposited over the semiconductor bulk substrate portion 64 and the SOI substrate portions 66, 68, as schematically illustrated in FIG. 4a by means of a layer 62. The person skilled in the art will appreciate that the layer 62 may actually represent, in accordance with some illustrative embodiments, one or more sub-layers comprising a high-k gate insulating material, e.g., hafnium oxide, and/or a work function adjusting material, e.g., TiN.

Figure 4B:
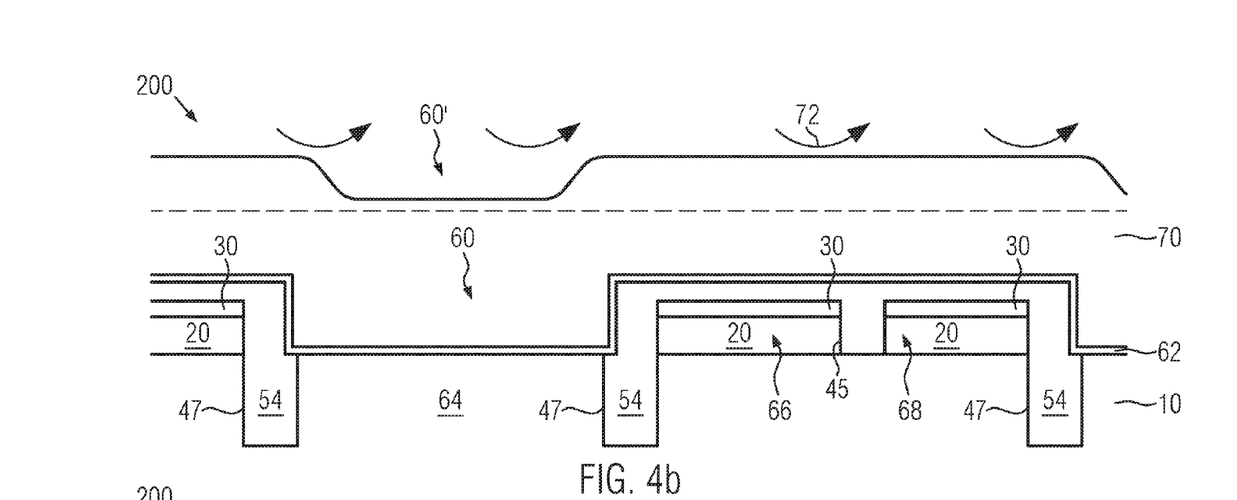

Next, as schematically illustrated in FIG. 4b, a gate electrode material or dummy gate electrode material 70 may be deposited over the layer 62. In accordance with some illustrative embodiments of the present disclosure, the gate electrode material layer or dummy gate electrode material layer 70 may be deposited up to a height of about 100 nm.

The person skilled in the art will appreciate that, in accordance with illustrative embodiments of the present disclosure employing gate-first processes, the gate electrode material 70 may comprise silicon, e.g., amorphous silicon or polysilicon. Alternatively, in accordance with other illustrative embodiments of the present disclosure employing gate-last techniques, the dummy gate electrode material 70 may comprise one of tungsten and silicon, e.g., polysilicon or amorphous silicon. In accordance with special examples employing the deposition of tungsten as dummy gate electrode material 70, tungsten has good properties for polishing and may be easily removed when compared to other materials. For example, variations of polysilicon after polishing may be, for example, in the range from about 10-15 nm.

Subsequent to the deposition of the dummy gate electrode material or gate electrode material 70, a polishing process 72 is performed for polishing the dummy gate electrode material or gate electrode material 70 down to a desired height level over the SOI substrate region 66/68 and the semiconductor bulk substrate region 64, as schematically indicated in FIG. 4b by a broken line, e.g., at a desired height level of about 30 nm over the semiconductor material layer 30.

Accordingly, variations in the height of the dummy gate electrode material or gate electrode material 70 may be removed, such as a depression 60' caused by the recess 60.

Figure 4C:
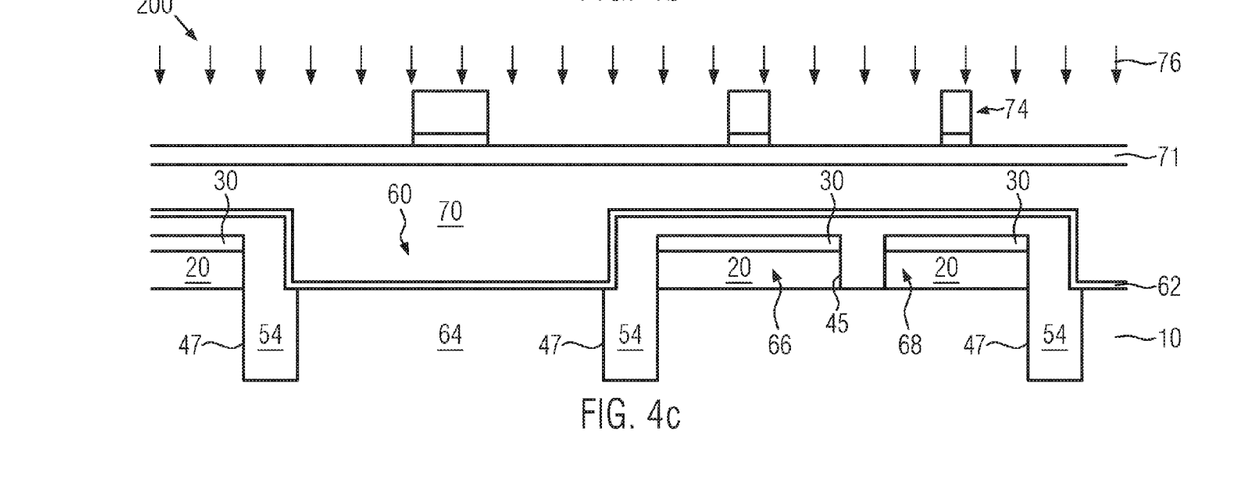

FIG. 4c schematically illustrates the semiconductor device structure 200 at a more advanced stage during fabrication, particularly after the polishing process 72 is completed and a patterned hard mask 74 is formed over the dummy gate electrode material or gate electrode material 70. The patterned hard mask 74 may be, for example, formed by depositing a nitride layer 71, followed by an oxide layer and a resin layer, the oxide layer and the resin layer being lithographically patterned. The lithographic patterning may be performed by using the SOH/aC approach or the TRL HM approach.

Figure 4D:
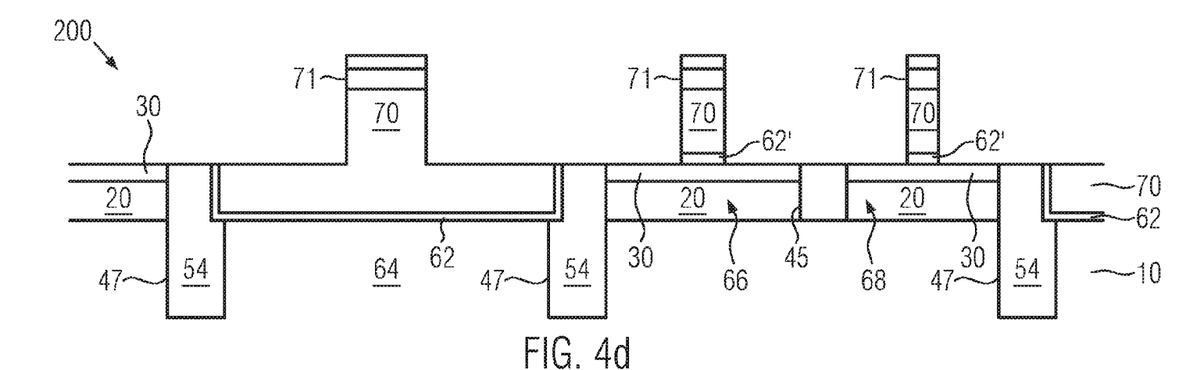

Next, an etch process 76 may be performed through the patterned hard mask 74, the etch process 76 defining gate structures or dummy gate structures over the SOI substrate regions 66, 68, as illustrated in FIG. 4d. The person skilled in the art will appreciate that the etching process 76 may be an anisotropic etch process, which stops on the semiconductor material layer 30, e.g., an RIE etch process. It is important to note that the dummy gate electrode material or gate electrode material 70 is not completely etched over the semiconductor bulk substrate portion 64. Alternatively, the etch process 76 may be a gate etch process with very high selectivity to oxide material such that the etch process 76 stops on the oxide material of the layer 62.

Figure 4E:
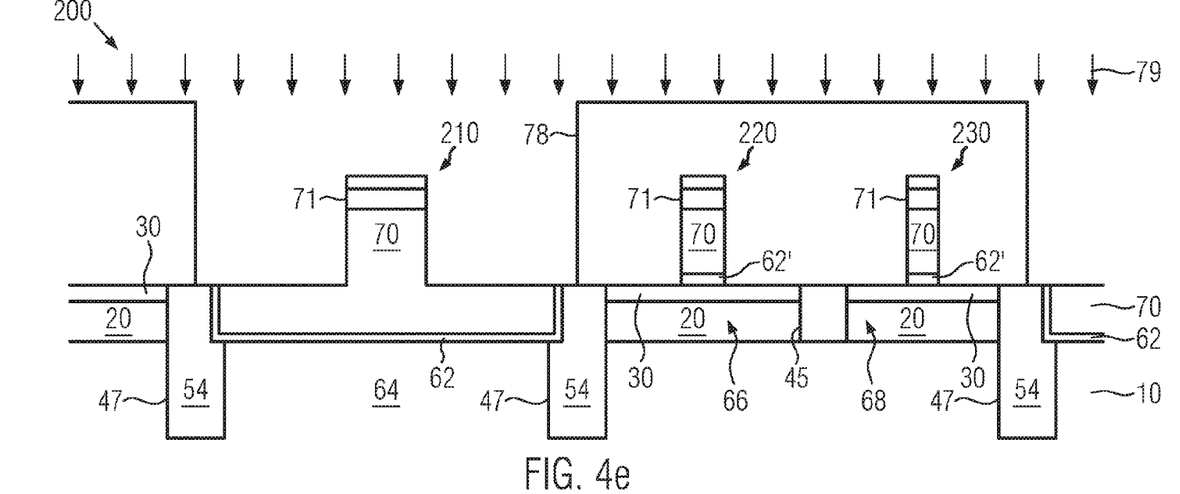

FIG. 4e schematically illustrates the semiconductor device structure 200 at a phase during fabrication in which the etch process 76 does not have a high enough selectivity to oxide material and the etch process 76 ends at the stage during fabrication which is illustrated in FIG. 4d. Subsequently, a block mask 78 may be formed over the semiconductor substrate 10 such that the bulk semiconductor device 210 is exposed to further processing, while SOI devices 220, 230 are covered by the block mask 78. Next, an etch process 79 may be performed through the block mask 78 to anisotropically etch the gate electrode material or dummy gate electrode material 70 of the bulk semiconductor device 210. The person skilled in the art will appreciate that the block mask 78 is arranged relative to the semiconductor bulk substrate portion 64 and the deep STI structures 47 such that the deep STI structures 47 are only partially covered by the block mask 78. In this way, a complete removal of the exposed gate electrode material or dummy gate electrode material 70 over the semiconductor bulk substrate portion 64 may be achieved and the formation of so called "conducting spacers," i.e., spacers formed by gate electrode material or dummy gate electrode material 70 covering sidewall surfaces of the deep trench isolation structure 47 and/or the layer 62 are avoided. Subsequently to the etch process 79, a resist strip clean process sequence (not illustrated) may be performed.

Figure 4F:
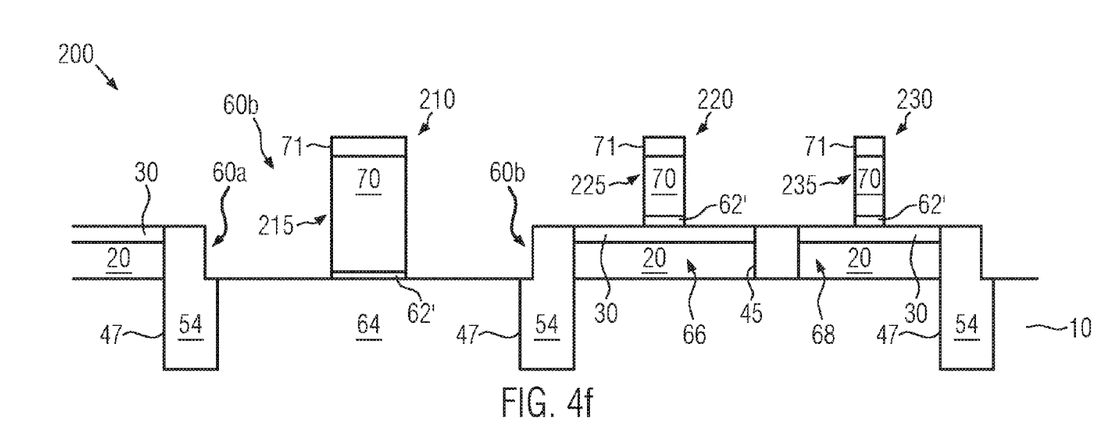

FIG. 4f schematically illustrates the semiconductor device structure 200 at a more advanced stage during fabrication, particularly after gate structures or dummy gate structures 215, 225, 235 are formed. Each of the gate structures or dummy gate structures 215, 225, 235 may comprise a gate insulating structure 62' with one or more gate insulating material layers (e.g., hafnium oxide material layers) and/or work function adjusting materials (e.g., TiN), a gate electrode layer or dummy gate electrode layer 70, and a gate cap 71. In accordance with some illustrative embodiments of the present disclosure, the gate insulating structure 62' may further comprise a cSiGe (not illustrated) layer.

The person skilled in the art will appreciate that at exposed sidewall portions 60a, 60b of the deep STI regions 47 facing the semiconductor bulk substrate portion 64, no "conducting spacers" are formed. Accordingly, due to the etch process 79, each of the materials 62, 70 is reliably removed from the sidewall portions 60a, 60b.

Subsequently, one or more implant sequences may be performed for forming source/drain regions (not illustrated) and/or hollow regions (not illustrated) in the semiconductor bulk substrate portion 64 and/or at least one of the SOI substrate portions 66, 68. In some special illustrative embodiments of the present disclosure, halo regions (not illustrated) may be only implanted into the bulk semiconductor device 210, while implantation of halo dopants into SOI devices 220, 230 may be omitted.

Figure 5A:
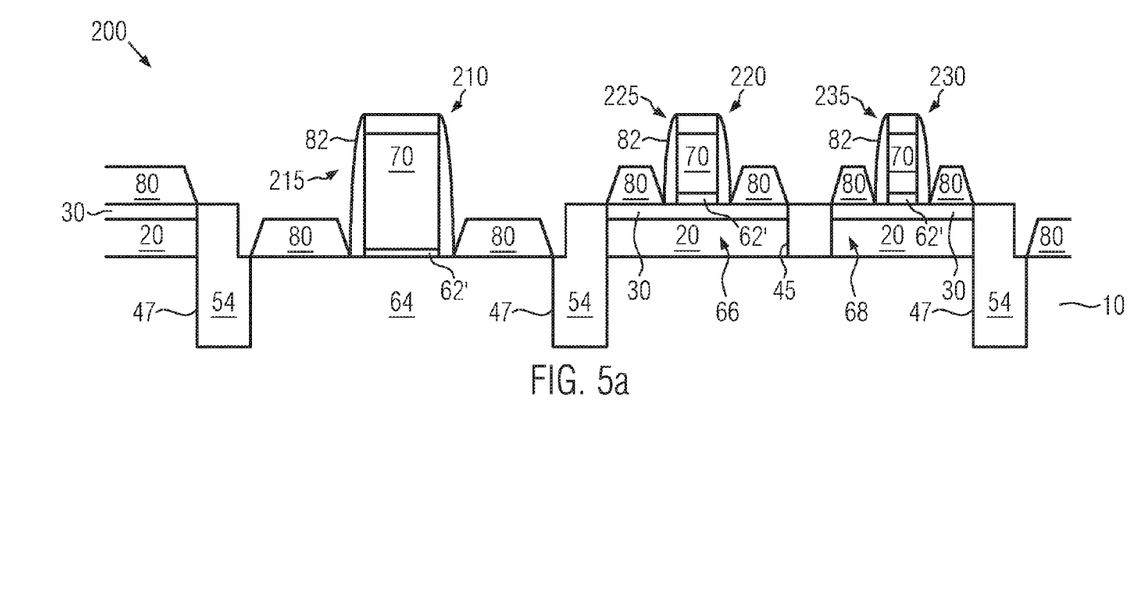
FIGS. 5a-5c schematically illustrate, in cross-sectional views, the formation of raised source/drain regions with contacts adjacent to the gate structures of FIGS. 4a-4f in accordance with some illustrative embodiments of the present disclosure.

FIG. 5a schematically illustrates the semiconductor device structure at a stage during fabrication in which sidewall spacers 82 are formed for adjusting a separation of source/drain regions to the gate structures or dummy gate structures 215, 225, 235, irrespective of whether source/drain regions are implanted or source/drain regions are grown so as to form raised source/drain regions 80 by epitaxially growing semiconductor material, e.g., at least one of silicon and germanium in case of PMOS devices, on exposed semiconductor material of the semiconductor substrate 10, i.e., on exposed portions of the semiconductor bulk substrate portion 64, and exposed portions of the semiconductor layer 30 in SOI substrate portions 66, 68. In accordance with some illustrative embodiments herein, doped semiconductor material may be epitaxially grown; alternatively, undoped semiconductor material may be epitaxially grown and dopants may be subsequently implanted for forming source/drain regions.

In accordance with some illustrative embodiments of the present disclosure, the formation of the raised source/drain regions 80 may comprise the deposition of an epi protection nitride liner (not illustrated) and the application of at least one lithographical step for opening semiconductor material portions over which the raised source/drain regions are to be formed by appropriately etching the epi protection nitride liner (not illustrated) and the application of an epitaxial growth process. In accordance with some explicitly disclosed examples herein, two separate lithographical steps may be performed in embodiments where N-type and P-type semiconductor devices are to be formed for forming silicon epi material in the case of N-type semiconductor (NMOS) devices and silicon germanium material in the case of P-type semiconductor (PMOS) devices. In accordance with some illustrative embodiments of the present disclosure, the semiconductor device 220 may be provided as an NMOS device and the semiconductor device 230 may be provided as a PMOS device, wherein the PMOS device 230 has raised source/drain regions 80 formed from epi silicon germanium material, while the NMOS device 220 has raised source/drain regions 80 formed from epi silicon.

Figure 5B:
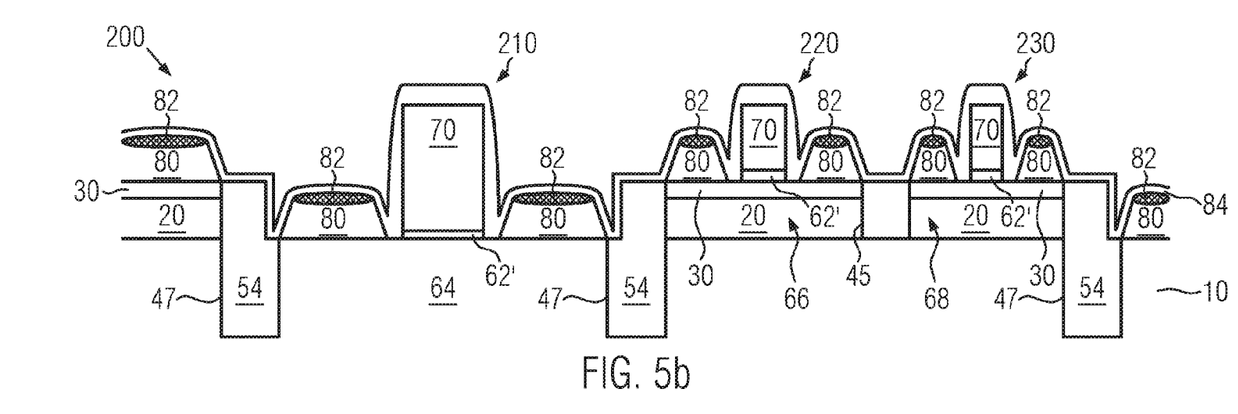

With regard to FIG. 5b, the semiconductor device structure 200 is schematically illustrated at a more advanced stage during fabrication, particularly in a stage at which silicide regions 82 are formed on the raised source/drain regions 80. For example, the silicide regions 82 may represent nickel silicide (Nisi) regions. The person skilled in the art will appreciate that the formation of silicide regions may comprise depositing a metal layer over the semiconductor device structure 200, performing an annealing process for forming silicide material over the semiconductor material portions and removing the remaining metal layer from above the semiconductor device structure 200. Herein, a conventional silicide block sequence may be performed for blocking areas that are not to be silicided. Subsequently to the salicitation process, a nitride liner 84 is deposited over the semiconductor device structure 200, as illustrated in FIG. 5b.

Figure 5C:
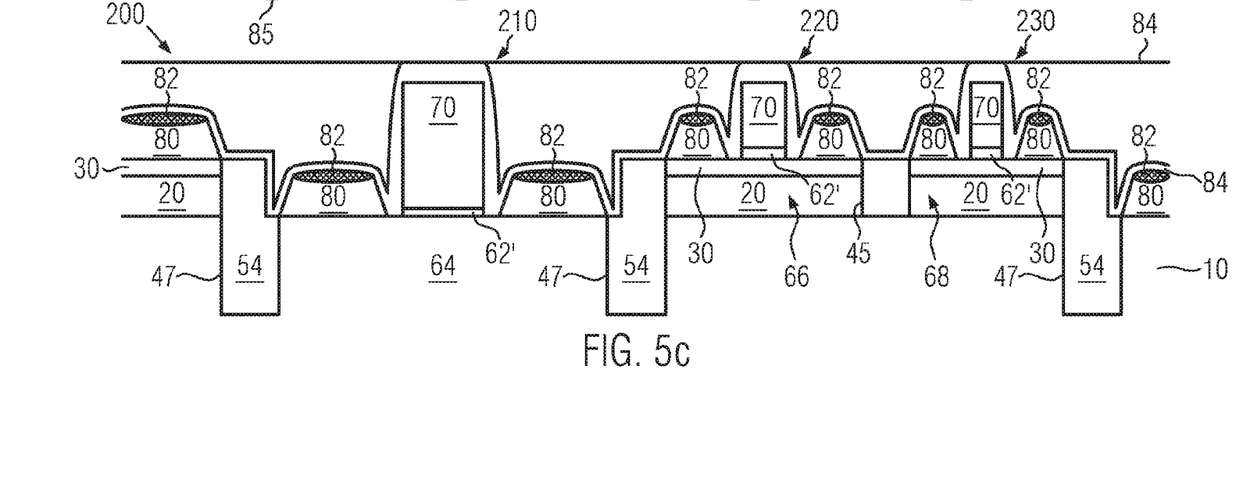

FIG. 5c schematically illustrates the semiconductor device structure 200 at a more advanced stage during fabrication, particularly after an ILD material 84 is deposited and a polishing process 85 is performed to polish the deposited ILD material down to the nitride liner 84. Accordingly, the nitride liner 84 over the gate structures 215, 225, 235 acts as a stop liner in the polishing process (not illustrated).

Figure 6A:
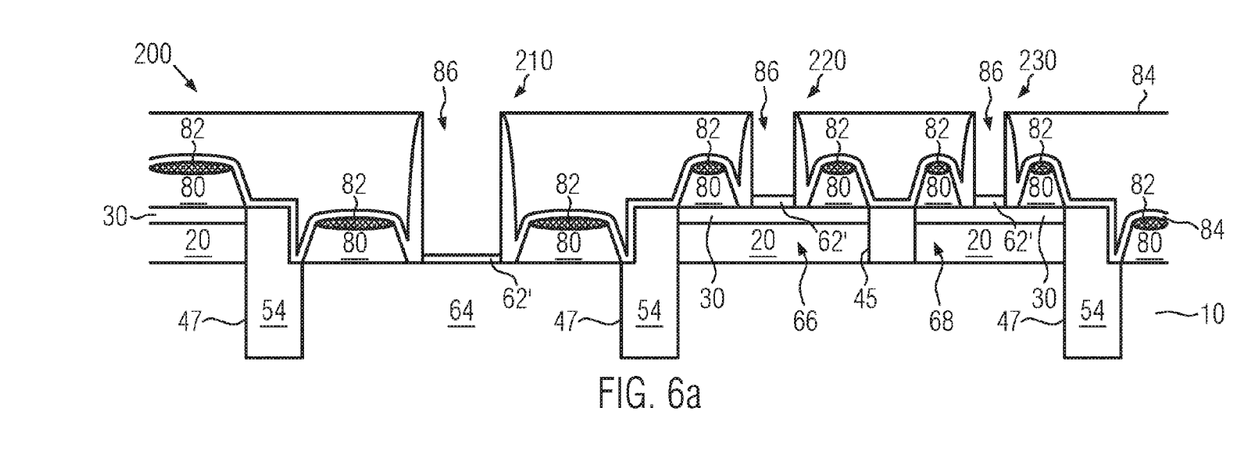
FIGS. 6a-6b schematically illustrate, in cross-sectional views, cointegrated semiconductor devices on bulk and SOI substrates in accordance with some illustrative embodiments of the present disclosure.

FIG. 6a schematically illustrates the semiconductor device structure 200 at a more advanced stage during gate-last processes. Particularly, the dummy gate structures 215, 225, 235 are opened and the dummy gate electrode material 70 is removed such that gate trenches 86 may be formed in the bulk semiconductor device 210, the SOI semiconductor device 220 and the SOI semiconductor device 230. The person skilled in the art will appreciate that in processes in which a thin silicon oxide layer 62' is present, high-k gate insulating materials and work function adjusting materials, as well as a gate electrode material, e.g., one of Al and Si, may be filled into the gate trenches 86. In processes in which a high-k gate insulating material is present in the layer 62', a work function adjusting material and a gate electrode material may be filled into the gate trenches 86 (so-called hybrid gate-last processes). In accordance with some alternative embodiments of the present disclosure, only a dummy gate electrode material is removed from within the dummy gate structures and a gate electrode material is filled into the gate trenches 86.

Figure 6B:
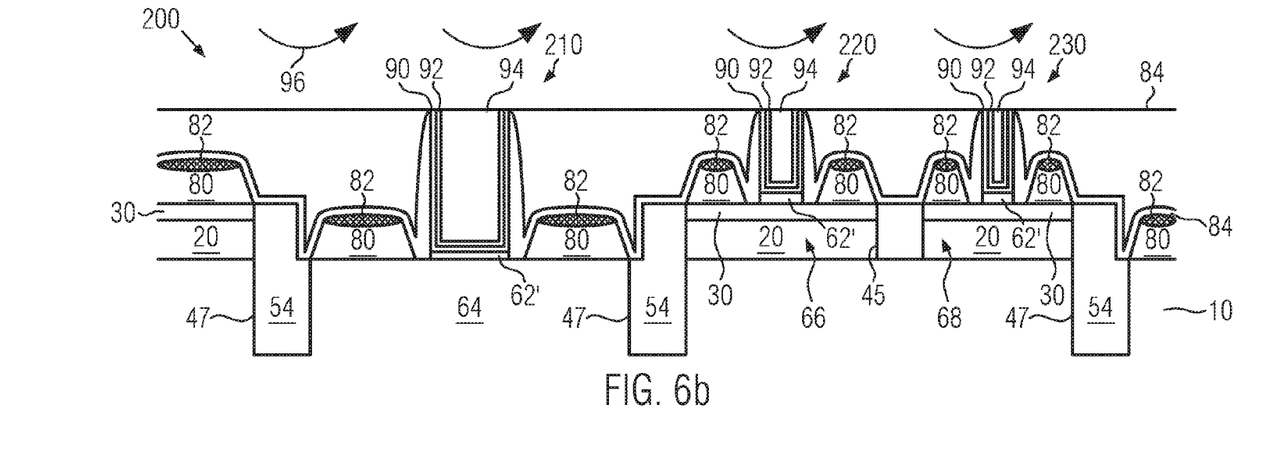

FIG. 6b schematically illustrates the semiconductor device structure 200 at a more advanced stage during fabrication, particularly in the gate-last processes after dummy materials are replaced by respective gate materials. In accordance with some special examples herein, the gate trenches 86 of FIG. 6a were filled up with high-k gate insulating materials 90, work function adjusting materials 92, and a gate electrode material 94. After the fill-in of the gate materials into the gate trenches, a further polishing process 96 may be performed in order to adjust a final gate height of the semiconductor device structure 200 relative to an upper surface of the semiconductor substrate 10. In accordance with some illustrative embodiments of the present disclosure, the final gate height may be in the range from about 15-25 nm, e.g., about 20 nm.

Although the semiconductor device structure 200 as it is described above and schematically illustrated in the figures represents a MOS device, the person skilled in the art will appreciate that the present disclosure is not limited to the bulk semiconductor device 210 being limited to a MOS device. In alternative embodiments of the present disclosure, the bulk semiconductor device 210 may be implemented by one of a resistor and a capacitor device. In case of capacitors or resistors, the final gate height represents the height of a resistor material or of an electrode material of a capacitor device. Accordingly, irrespective of whether MOS devices or non-MOS devices are formed over the semiconductor bulk substrate portion 64, the semiconductor device structure 200 as it is obtained in process flows of the present disclosure has a common height level. In accordance with some illustrative embodiments of the present disclosure, the final gate height may be in the range from about 15-25 nm, e.g., about 20 nm.

The process flow may continue in accordance with standard techniques for forming contacts to the silicide regions.

The present disclosure addresses topology issues in the cointegration of bulk and SOI devices. As a solution, bulk and SOI devices of a common height are formed in gate-last or gate-first techniques. For example, in gate-last approaches, an appropriate initial dummy gate height thickness may be chosen in order to decouple the gate-last approach from topology issues as the final gate height is not defined by the initial gate stack thickness but at a later stage during fabrication. Accordingly, this additional degree of freedom enables the advantageous combination of fully depleted devices and bulk devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   an SOI structure comprising:
      a bulk semiconductor substrate;
      a buried insulation layer positioned on said bulk semiconductor substrate; and
      a semiconductor layer positioned on said buried insulation layer, wherein, in a first region of said SOI structure, said semiconductor layer and said buried insulation layer are removed and, in a second region of said SOI structure, said semiconductor layer and said buried insulation layer are present above said bulk semiconductor substrate;
   a semiconductor bulk device comprising a first gate structure positioned on said bulk semiconductor substrate in said first region; and
   an SOI semiconductor device comprising a second gate structure positioned on said semiconductor layer in said second region, wherein said first and second gate structures have a final gate height substantially extending to a common height level above an upper surface of said bulk semiconductor substrate.

2. The product of claim 1, wherein said first and second gate structures comprise aluminum.

3. The product of claim 1, further comprising raised source/drain regions in said first and second regions adjacent said first and second gate structures, said raised source/drain regions being formed from doped silicon material disposed on said bulk semiconductor substrate in said first region and on said semiconductor layer in said second region.

4. The product of claim 1, wherein said buried insulation layer comprises silicon dioxide, said bulk semiconductor layer comprises silicon and said semiconductor layer comprises silicon.

5. The product of claim 1, wherein said semiconductor bulk device is a transistor and said SOI semiconductor device is a transistor.

6. An integrated circuit product, comprising:
an SOI structure comprising:
a bulk semiconductor substrate;
a buried insulation layer positioned on said bulk semiconductor substrate; and
a semiconductor layer positioned on said buried insulation layer, wherein, in a first region of said SOI structure, said semiconductor layer and said buried insulation layer are removed and, in a second region of said SOI structure, said semiconductor layer and said buried insulation layer are present above said bulk semiconductor substrate;
a resistor device positioned on said bulk semiconductor substrate in said first region, said resistor device being formed by a resistor material; and
an SOI semiconductor device comprising a gate structure positioned on said semiconductor layer in said second region, wherein an upper surface of said resistor material and an upper surface of said gate structure substantially extend to a common level above an upper surface of said bulk semiconductor substrate.

7. The product of claim 6, wherein said SOI semiconductor device is a transistor.

8. An integrated circuit product, comprising:
an SOI structure comprising:
a bulk semiconductor substrate;
a buried insulation layer positioned on said bulk semiconductor substrate; and
a semiconductor layer positioned on said buried insulation layer, wherein, in a first region of said SOI structure, said semiconductor layer and said buried insulation layer are removed and, in a second region of said SOI structure, said semiconductor layer and said buried insulation layer are present above said bulk semiconductor substrate;
a capacitor device with a capacitor material positioned on said semiconductor substrate in said first region; and
an SOI semiconductor device comprising a gate structure positioned on said semiconductor layer in said second region, wherein an upper surface of said capacitor material and an upper surface of said gate structure substantially extend to a common height level above an upper surface of said bulk semiconductor substrate.

9. The product of claim 8, wherein said buried insulation layer comprises silicon dioxide, said bulk semiconductor layer comprises silicon and said semiconductor layer comprises silicon.

10. The product of claim 9, wherein said SOI semiconductor device is a transistor.

* * * * *